United States Patent [19]

Wagoner

[11] Patent Number: 4,736,268
[45] Date of Patent: Apr. 5, 1988

[54] HIGH FREQUENCY AC SOLID STATE SWITCH

[75] Inventor: Robert G. Wagoner, Lima, Ohio

[73] Assignee: Westinghouse Electric Corp., Pittsburgh, Pa.

[21] Appl. No.: 943,093

[22] Filed: Dec. 18, 1986

[51] Int. Cl.$^4$ .............................................. H02H 3/22
[52] U.S. Cl. ..................................... 361/111; 361/91
[58] Field of Search ..................... 361/8, 13, 2, 54, 56, 361/91, 111, 115

[56] References Cited

U.S. PATENT DOCUMENTS

| 4,028,737 | 6/1977 | Bailey | 361/111 X |
| 4,271,460 | 6/1981 | Baker | 361/13 X |
| 4,424,544 | 1/1984 | Chang et al. | 361/91 X |
| 4,644,437 | 2/1987 | Robe | 361/56 |

FOREIGN PATENT DOCUMENTS 29949 3/1977 Japan .................................... 361/111

Primary Examiner—Pellinen A. D.
Assistant Examiner—A. Jonathan Wysocki
Attorney, Agent, or Firm—R. P. Lenart

[57] ABSTRACT

An AC solid state switch includes an inverse parallel connection of a pair of silicon controlled rectifiers. A circuit branch which includes the series connection of the main conducting paths of a pair of field effect transistors is electrically connected in parallel with the inverse parallel arrangement of silicon controlled rectifiers. Gate power sources provide continuous gate drive signals to the silicon controlled rectifiers and field effect transistors. By including the field effect transistors, voltage transients across the switch are reduced in high frequency AC power systems.

6 Claims, 2 Drawing Sheets

HIGH FREQUENCY AC SOLID STATE SWITCH

BACKGROUND OF THE INVENTION

This invention relates to electronic switching circuits and more particularly to such circuits wherein the principal switching elements are thyristors connected in an inverse parallel relationship.

To control power in an AC load circuit, semiconductor switch devices have been used because of their inherent advantages over mechanical and electromechanical switching elements. A common form of AC switch comprises a pair of thyristors connected in inverse parallel fashion which requires a driver circuit for the gate terminal of each of the thyristors. There are several known methods of supplying gate drive current to inverse parallel thyristors. These methods include pulse drive, continuous drive and load current drive.

At common, relatively low AC power frequencies, the continuous drive method is preferred to avoid voltage spikes across the switch circuit which may occur with load current drive and to avoid the possible turn off of all the thyristors under light-load current conditions which may occur with pulse drive. However, at relatively high power frequencies, for example 20 kHz, voltage spikes have been found to occur across the switch circuit even with continuous gate drive delivered to the thyristors. Such voltage spikes can create electromagnetic interference and may be otherwise detrimental to associated circuitry. It is therefore desirable to construct an AC solid state switching circuit, for use in relatively high frequency AC systems, which maintains the desirable characteristics of an inverse parallel arrangement of thyristors but does not exhibit excessive voltage spikes following zero crossovers of the current waveform.

SUMMARY OF THE INVENTION

An AC solid state switch constructed in accordance with this invention includes first and second silicon controlled rectifiers each having a gate, a cathode and an anode. The anode of the first rectifier is electrically connected to the cathode of the second rectifier and the cathode of the first rectifier is electrically connected to the anode of the second rectifier such that the first and second silicon controlled rectifiers are electrically connected in an inverse parallel arrangement. The switch further includes first and second field effect transistors, each having a gate, a drain, a source and a main conducting path between the drain and the source. The main conducting paths of these field effect transistors are electrically connected in series with each other to form a circuit branch which is connected in parallel with the first and second silicon controlled rectifiers. Means is provided for applying gate signals to the gates of the first and second silicon controlled rectifiers and the gates of the first and second field effect transistors.

When the switches of this invention are operated in relatively high frequency AC systems, for example, systems operating at frequencies of 20 kHz, a significant reduction in voltage spikes across the switch is achieved.

DESCRIPTION OF THE PREFERRED EMBODIMENT

Figure 1:
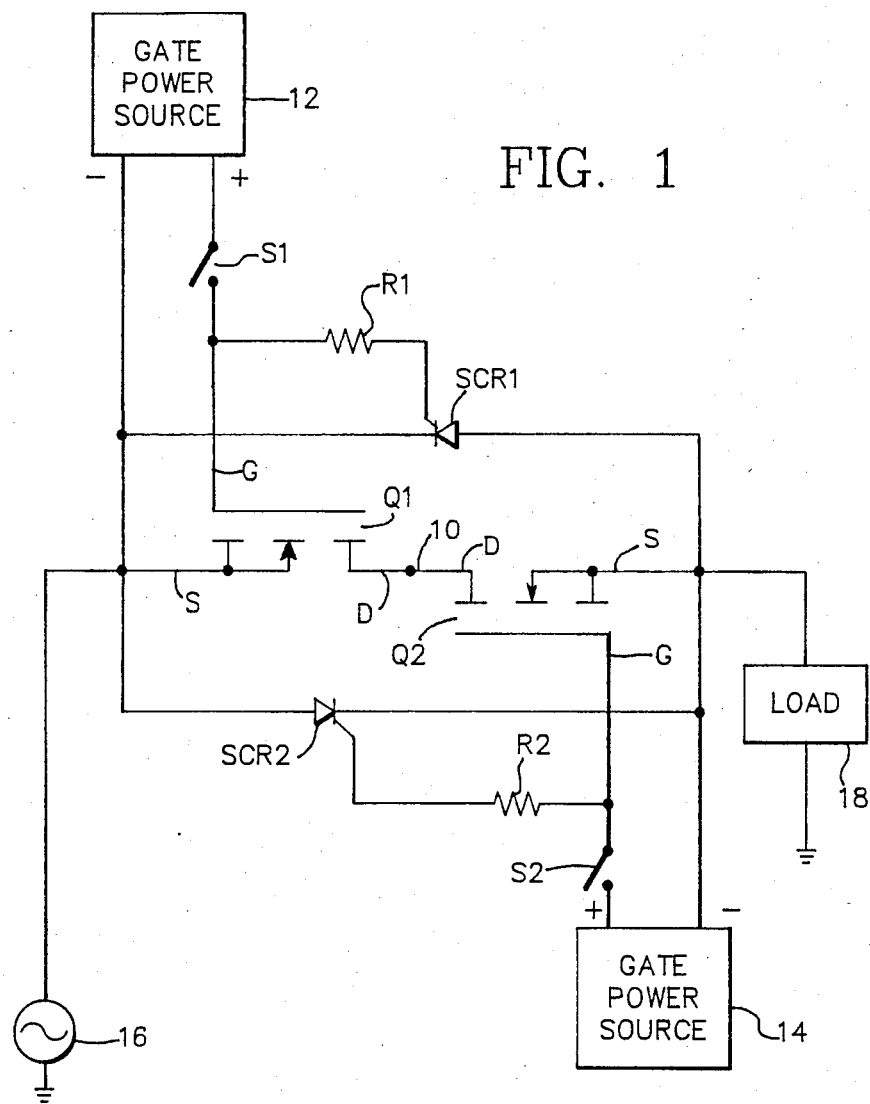
FIG. 1 is a schematic diagram of an AC solid state switch constructed in accordance with one embodiment of the present invention.

Referring to the drawings, FIG. 1 is a schematic diagram of an AC solid state switch constructed in accordance with one embodiment of the present invention. This switch includes two silicon controlled rectifiers SCR1 and SCR2 each having a gate, an anode and a cathode. The anode of SCR1 is electrically connected to the cathode of SCR2 and the cathode of SCR1 is electrically connected to the anode of SCR2 such that the two silicon controlled rectifiers are electrically connected in an inverse parallel arrangement. A pair of metal oxide semiconductor field effect transistors Q1 and Q2, each having a gate, a drain, a source and a main conducting path between the drain and the source, are electrically connected to form a circuit branch 10 which includes the series connection of the main conducting paths of the field effect transistors. This circuit branch is connected in parallel with the first and second silicon controlled rectifiers. A pair of gate power sources 10 and 12, which may be constructed in accordance with the prior art, provide means for applying gate signals to the gates of the first and second silicon controlled rectifiers and the gates of the first and second field effect transistors. Resistors R1 and R2 are provided to deliver the appropriate gate current to their associated silicon controlled rectifiers. In this embodiment, gate power sources continuously provide 15 volts DC and switches S1 and S2 schematically represent means for applying the gate voltages to the switching devices. An AC power source 16, having a relatively high frequency of for example 20 kHz can be electrically connected to the load 18 by closing switches SW1 and SW2.

Figure 2:
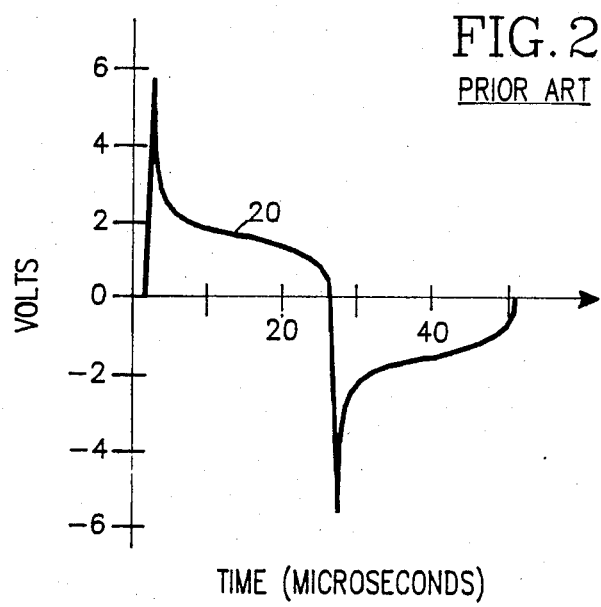
FIG. 2 is a waveform which illustrates the voltage across a prior art switch wherein the main switching elements are a pair of thyristors in an inverse parallel arrangement.

FIG. 2 is a waveform 20 which illustrates the voltage appearing across a prior art AC solid state switch wherein the main switching devices are two silicon controlled rectifiers connected in an inverse parallel arrangement. For a 200 volt, 20 kHz power source which delivers 10 amps to a resistive load, voltage spikes of approximately 5.6 volts are seen to occur across the switch following each current zero.

Figure 3:
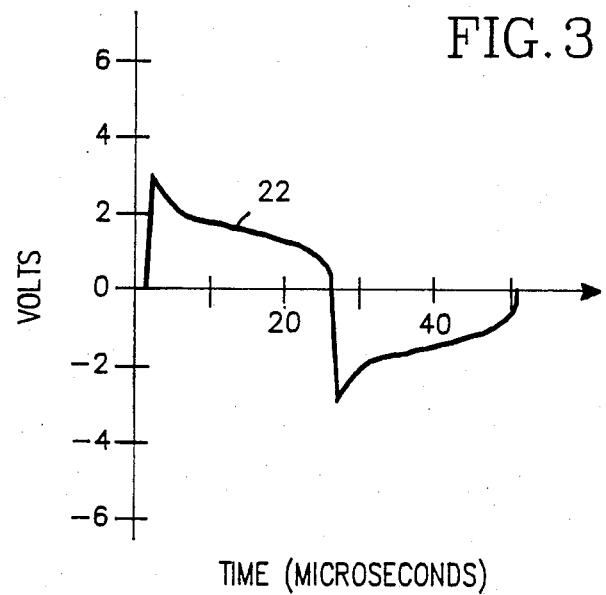
FIG. 3 is a waveform of the voltage across the AC solid state switch of FIG. 1.

FIG. 3 is a waveform 22 of the switch voltage for one embodiment of the present invention using the same source and load as was used to generate the waveform of FIG. 2. In this case, the voltage spikes following each current zero have been reduced to approximately 3 volts.

It can therefore be seen that by adding a pair of series-connected field effect transistors in parallel with an inverse parallel arrangement of silicon controlled rectifiers, the transient performance of the circuit is significantly improved. It should be noted that since the field effect transistors include voltage driven gates, prior art gate power sources can be used without modification.

In order to provide a more complete description of the present invention, Table I lists the components used to construct the AC solid state switch of FIG. 1.

TABLE I

| Component Specifications for FIG. 1 | |
| --- | --- |
| Item | Type |
| SCR1, SCR2 | Westinghouse T607081854BT |
| Q1, Q2 | Motorola MTM6N60 |
| R1, R2 | 40 ohm, 5 watt |

This embodiment uses metal oxide semiconductor field effect transistors (MOSFET) which act like a low resistance across the switching SCRs and conduct most of the load current during the time when the voltage spikes occur. The load current is relatively low at that time. Throughout the rest of the cycle, the SCRs conduct the majority of the current. The MOSFET's provide a low resistance to current in the ON state. However, the built in diode across the drain to source junction makes it necessary to use two MOSFETs in inverse series to block current in the OFF state.

Although the present invention has been disclosed in terms of what is at present believed to be its preferred embodiment, it will be apparent to those skilled in the art that various changes may be made without departing from the scope of the invention. For example, pulse gate drive could be used to turn on the SCR's and FET's. The pulses would be applied at zero crossover and would have sufficient width so that the FET's are ON during the time when the voltage spike would occur. The SCR's would continue to conduct until the next zero crossover. It is therefore intended that the appended claims include such changes.

What is claimed is:

1. An AC solid state switch comprising:
   a first silicon controlled rectifier having a gate, a cathode and an anode;
   a second silicon controlled rectifier having a gate, a cathode and an anode;
   the anode of said first silicon controlled rectifier being electrically connected to the cathode of said second silicon controlled rectifier and the cathode of said first silicon controlled rectifier being electrically connected to the anode of said second silicon controlled rectifier, such that said first and second silicon controlled rectifiers are electrically connected in an inverse parallel arrangement;
   first and second field effect transistors, each having a gate, a drain, a source and a main conducting path between the drain and the source;
   a circuit branch including the series connection of the main conducting paths of said first and second field effect transistors;
   said circuit branch being electrically connected in parallel with said first and second silicon controlled rectifiers; and
   means for substantially simultaneously applying turn-on gate signals to the gates of said first silicon controlled rectifier and said first field effect transistor, and for substantially simultaneously applying turn-on gate signals to the gates of said second silicon controlled rectifier and said second field effect transistor.

2. An AC switch as recited in claim 1, wherein said gate signals are continuous DC signals.

3. An AC switch as recited in claim 1, wherein said first and second field effect transistors are metal oxide semiconductor field effect transistors.

4. An AC switch as recited in claim 1, wherein the drains of said first and second field effect transistors are electrically connected together.

5. An AC switch as recited in claim 1, wherein said means for applying gate signals comprises:
   a first gate power source coupled to the gates of said first silicon controlled rectifier and said first field effect transistor; and
   a second gate power source coupled to the gates of said second silicon controlled rectifier and said second field effect transistor.

6. An AC switch as recited in claim 1, wherein said gate signals are pulses applied at zero crossings of an external AC voltage.

* * * * *